(12) United States Patent
Kim et al.

(10) Patent No.: US 6,273,275 B1
(45) Date of Patent: *Aug. 14, 2001

(54) CASSETTE FOR LOADING GLASS SUBSTRATES

(75) Inventors: Moo Gap Kim; Eun Chan Yoo, both of Kyungsangbuk-do (KR)

(73) Assignee: LG Electronics Inc., Seoul (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/075,182

(22) Filed: May 11, 1998

(30) Foreign Application Priority Data

Nov. 20, 1997 (KR) .................................................. 97-61397

(51) Int. Cl.⁷ .................................................. A47G 19/08
(52) U.S. Cl. .................... 211/41.18; 211/41.1; 206/454; 118/500; 312/9.47; 312/9.63; 312/209
(58) Field of Search .............................. 211/41.18, 123, 211/191; 206/711, 454, 455, 456, 708, 707, 717; 118/500; 294/161; 312/287, 351, 117, 9.47, 9.63, 209, 4.63

(56) References Cited

U.S. PATENT DOCUMENTS

| Re. 25,912 | * | 11/1965 | Kaufman et al. ................ 211/191 X |
| 212,511 | * | 2/1879 | Roselius ........................... 211/191 X |
| 858,831 | * | 7/1907 | Sherman, Jr. .................... 312/351 X |
| 874,087 | * | 12/1907 | Kinsey ............................... 312/351 X |
| 1,747,026 | * | 2/1930 | Phillips ............................. 211/191 X |
| 2,215,511 | * | 9/1940 | King .................................. 312/351 X |
| 3,052,363 | * | 9/1962 | Foote, Jr. et al. ................ 312/351 X |
| 3,080,203 | * | 3/1963 | Graham ............................. 312/351 X |
| 3,279,876 | * | 10/1966 | St. Cyr ................................... 312/351 |
| 3,313,424 | * | 4/1967 | Gingher ........................... 211/123 X |
| 3,321,117 | * | 5/1967 | Hedin ............................... 312/351 X |
| 3,442,395 | * | 5/1969 | Taylor ................................ 211/41.3 |
| 3,464,748 | * | 9/1969 | Gregory ........................... 312/351 X |
| 3,963,290 | * | 6/1976 | Rennemann ..................... 211/191 X |
| 4,142,637 | * | 3/1979 | Kraiss ............................... 211/191 X |
| 4,153,164 | * | 5/1979 | Hofmeister et al. .............. 211/41.18 |
| 4,664,265 | * | 5/1987 | George, Jr. ........................ 211/41.18 |
| 4,872,554 | * | 10/1989 | Quernemoen ................... 118/500 X |
| 5,785,186 | * | 7/1998 | Babbs et al. ...................... 211/41.18 |
| 5,853,214 | * | 12/1998 | Babbs et al. .................. 211/41.18 X |
| 5,890,598 | * | 4/1999 | Hayashida et al. .............. 206/454 X |

FOREIGN PATENT DOCUMENTS

| 4003448A1 | 8/1991 | (DE) . |
| 10-59454 | 3/1998 | (JP) . |
| 189470 | * 5/1964 | (SE) .................................. 211/41.2 |
| WO 97/28724A1 | 8/1997 | (WO) ............................... 211/41.18 |
| WO 97/19868A1 | 6/1999 | (WO) ............................... 211/41.18 |

* cited by examiner

Primary Examiner—Daniel P. Stodola
Assistant Examiner—Khoa Tran

(57) ABSTRACT

A cassette for housing glass which includes edge supporting members provided at the side supports for supporting glass substrates in a stacked relationship; horizontal substrate supporting members alternately disposed between the edge supporting members and extending across the cassette between the side supports, and substrate-fixing members disposed on the horizontal substrate-supporting members and intermediate the side supports for supporting glass substrates to be suspended from the edge supporting members within the cassette.

15 Claims, 3 Drawing Sheets

CASSETTE FOR LOADING GLASS SUBSTRATES

BACKGROUND OF THE INVENTION

The present invention relates to a cassette for loading glass substrates, and more particularly to a cassette for loading glass substrates which is small and light and prevents large glass substrates for liquid crystal display devices from drooping and reducing the pitch between adjacent glass substrates.

Generally, a cassette is part of an assembly of elements, e.g. fixing elements and controlling and guiding cutter devices, etc. Therefore, a cassette for loading glass substrates of a liquid crystal display device utilizes a glass substrate-carrying robot for guiding them to the next step in the process of manufacturing liquid crystal display devices.

FIG. 1 is a front view of a conventional cassette for loading glass substrates. As shown in the figure, the conventional cassette for loading glass substrates 10 has a plurality of edge supporting members 5 for maintaining glass substrates 3 in position inside the cassette.

Since the edge supporting member 5 is fixed as a protrusion to both side supports 7 of the cassette 10, when loading the glass substrate 3 of a liquid crystal display device, the edge supporting members 5 support the ends of the glass substrate 3 but not the middle portion thereof, which permits the glass substrate to sag or droop. In connection with a glass substrate 3 of a liquid crystal display device, because its thickness is less than 1 mm and the degree of drooping or sagging is in proportion to the size of the glass substrate, the possibility of the glass substrate breaking is substantially increased.

Moreover, because it is hard to maintain the loaded glass substrate in a horizontal position, it is easy to cause interference with a glass substrate-carrying robot, and therefore the damage rate of the glass substrate is very high. Furthermore, the conventional cassettes for loading glass substrates have been generally applied to glass substrates for small size liquid crystal display devices, so that it is inappropriate to apply these cassettes to glass substrates for large size liquid crystal display devices.

SUMMARY OF THE INVENTION

Accordingly, it is an object of the present invention to provide a cassette for loading glass substrates which has substrate-supporting members which are mounted vertically to the width and the horizontal length of the glass substrate utilized for liquid crystal display devices and minimize the pitch between the glass substrates, and its volume and weight.

In order to realize this objective, the cassette for loading glass substrates of the present invention utilizes a plurality of horizontal substrate-supporting members to relieve the impact added to the glass substrates.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
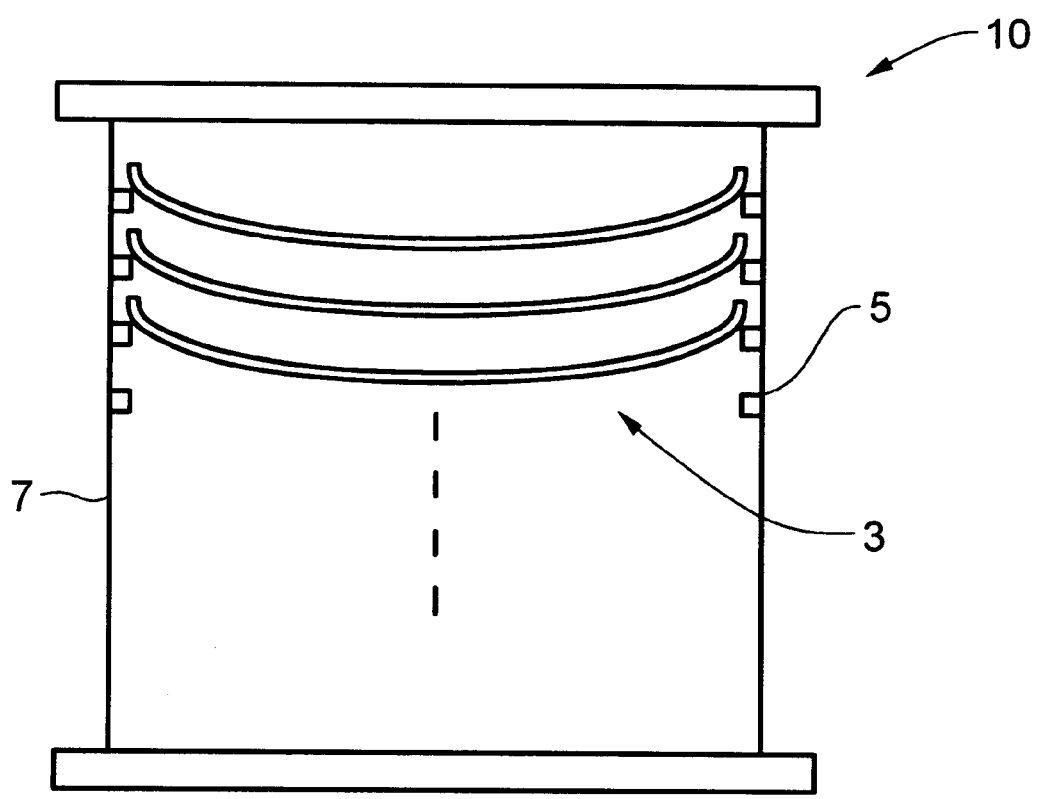
FIG. 1 is a front sectional view of a conventional cassette for loading glass substrates.
Figure 2:
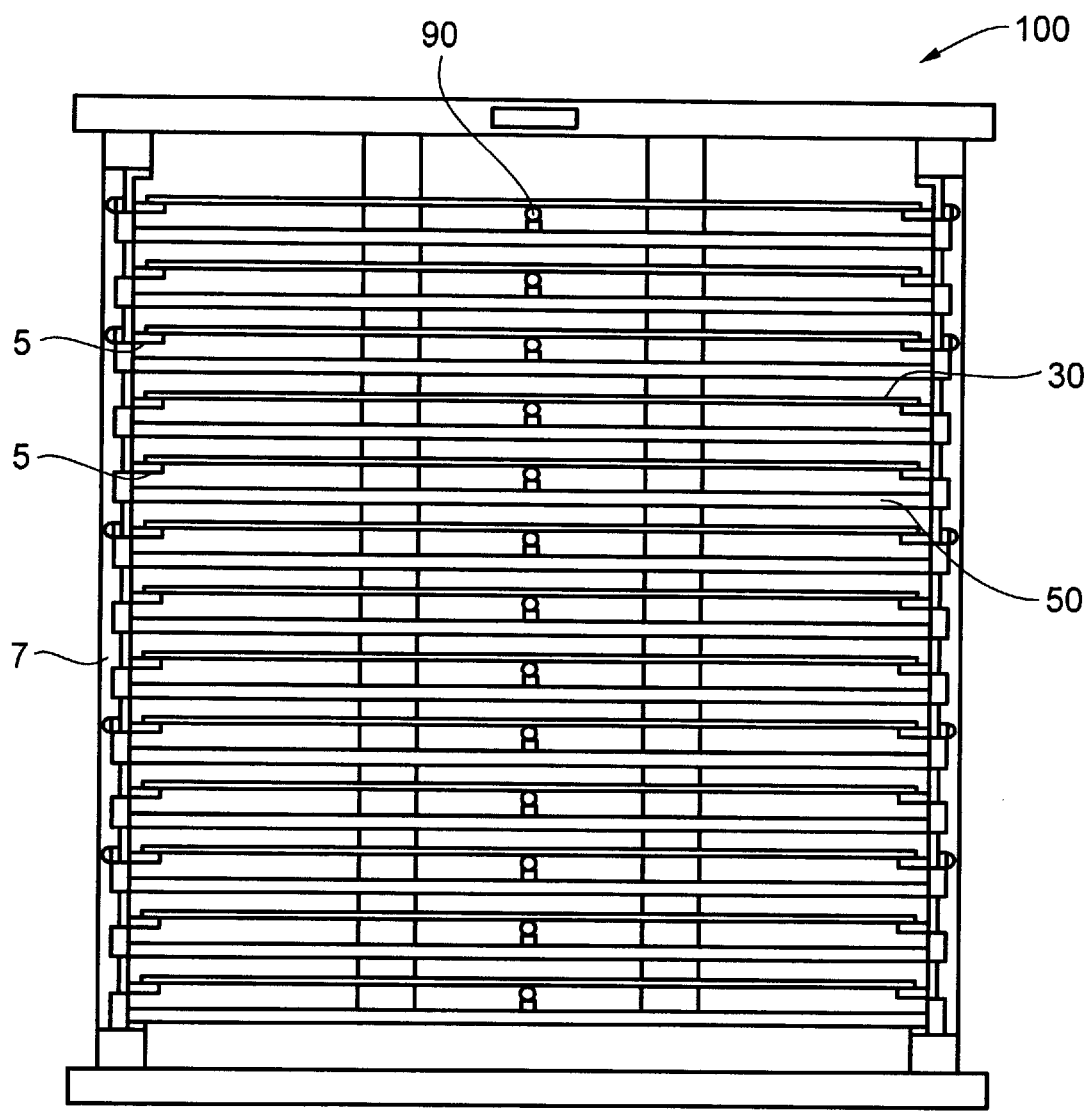
FIG. 2 is a front sectional view of a cassette for loading glass substrates according to the present invention.
Figure 3:
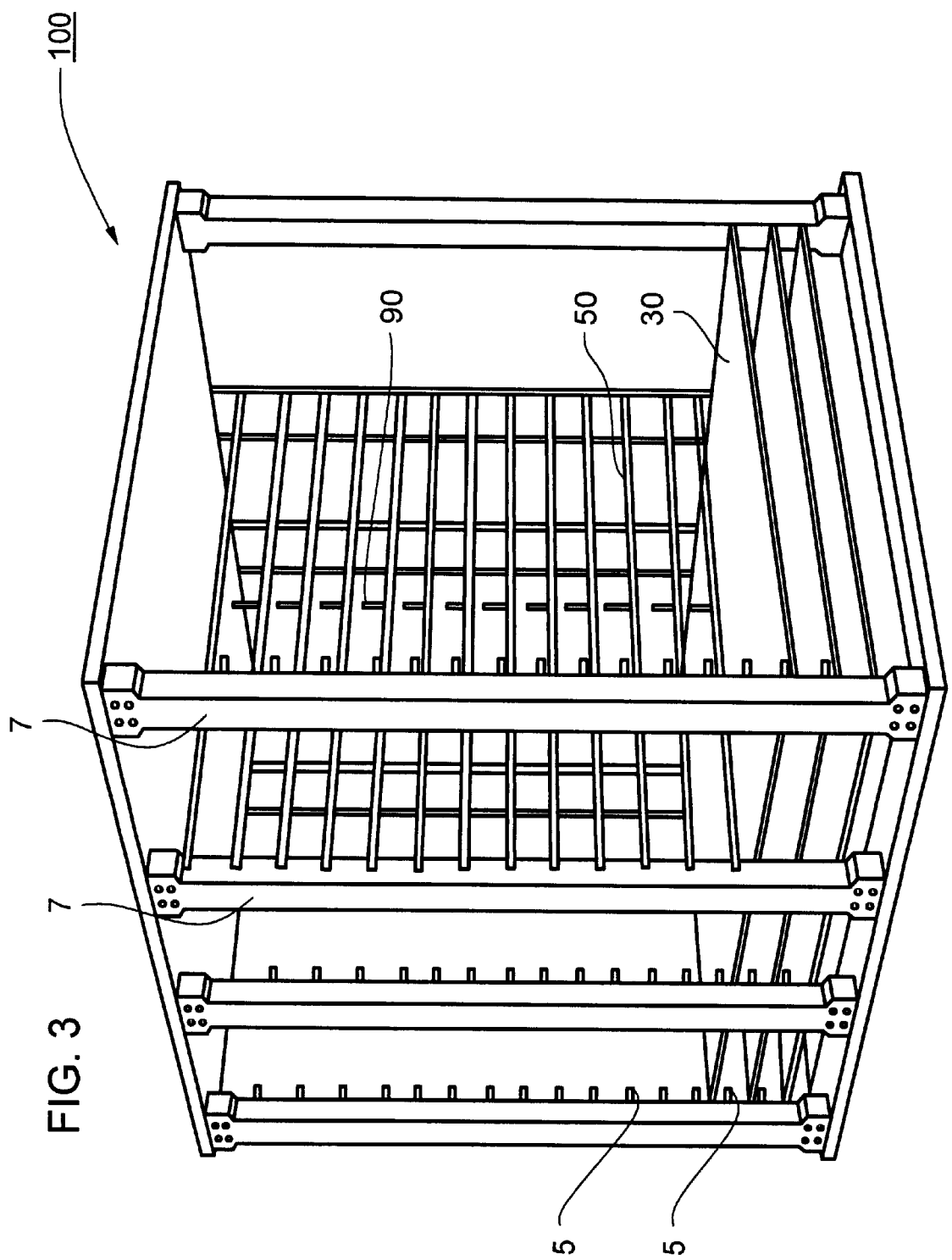
FIG. 3 is a perspective view of a cassette for loading glass substrates according to the present invention.

Hereinafter, a cassette for loading glass substrates according to the present invention is explained in detail with reference to the drawings. Similar to the cassette 10 shown in FIG. 1, cassette 100 shown in FIGS. 2 and 3 also includes side supports 7 and a plurality of edge supporting members 5.

As shown in the figures, the cassette 100 for loading glass substrates of the present invention comprises a plurality of horizontal substrate-supporting members 50, and substrate-fixing members 90 formed on the horizontal substrate-supporting members 50 to provide relief from any impact transferred to the glass substrates.

The horizontal substrate supporting member 50 minimizes the degree of sagging of the glass substrate 30 by maintaining the loaded glass substrate 30 in a horizontal position. As an example, in the case of 670 mm×830 mm glass substrate, the degree of horizontal drooping or sagging is within 1 mm. The horizontal substrate supporting-member 50 can be metal or plastic or any other material which can function as the horizontal substrate-supporting member.

Additionally, in the cassette for loading glass substrates of the present invention, the horizontal substrate-supporting member 50 is fixed on the inner sides of the cassette so that the weight of the glass substrate is dispersed. Thus, when the cassette 100 moves, the adverse effects due to vibration, etc. is minimized.

The substrate-fixing member 90 is made of an elastomer, etc. which prevents the glass substrate from being scratched, from receiving an impact from the horizontal substrate-supporting member 50, and maintains the loaded glass substrate stable.

In the cassette for loading glass substrates of the present invention, the pitch between adjacent glass substrates is reduced by maintaining a constant interval between the substrate-supporting members, thereby minimizing its volume and weight. Moreover, it prevents the glass substrate from breaking due to interference with the glass substrate-carrying robot.

It is further understood by those skilled in the art that the foregoing description is a preferred embodiment of the disclosed device and that various changes and modifications may be made in the present invention without department from the spirit and scope thereof.

What is claimed is:

1. A cassette containing side supports for housing glass substrates, said cassette comprising:
   edge support members provided at said side supports for supporting glass substrates in a stacked relationship;
   horizontal substrate supporting members alternately disposed between said edge support members and extending across said cassette between said side supports, and
   substrate-fixing members disposed on said horizontal substrate-supporting members and intermediate said side supports for supporting glass substrates within the cassette, wherein the substrate-fixing members are disposed to project upwardly from respective horizontal substrate-supporting members.

2. The cassette according to claim 1, wherein the substrate-fixing members are disposed in a center portion of the horizontal substrate-supporting member.

3. The cassette according to claim 1, wherein the horizontal substrate-supporting members are made of a metal.

4. The cassette according to claim 1, wherein the horizontal substrate-supporting members are made of a plastic.

5. The cassette according to claim 1, wherein the substrate-fixing members are made of an elastomer.

6. A cassette for housing a glass substrate, comprising:

two side supports;

two edge support members connected to respective side supports to support opposite edges of a glass substrate;

a horizontal substrate supporting member linearly connected between facing sides of the side supports and below the edge support members; and a substrate-fixing member disposed on the horizontal substrate-supporting member to support a central portion of the glass substrate, wherein the substrate-fixing member is disposed to project upwardly from the horizontal substrate-supporting member.

7. The cassette according to claim 6, wherein the substrate-fixing member is disposed in a center portion of the horizontal substrate-supporting member.

8. The cassette according to claim 6, wherein the horizontal substrate supporting member is made of a metal material.

9. The cassette according to claim 6, wherein the horizontal substrate supporting member is made of a plastic material.

10. The cassette according to claim 6, wherein the substrate-fixing member includes an elastomer material.

11. A cassette for housing a glass substrate, comprising:

two side supports;

a plurality of pairs of edge support members connected to respective side supports, each pair arranged to support opposite edges of a glass substrate;

a plurality of horizontal substrate supporting members connected between the side supports, each horizontal substrate supporting member being located below a corresponding pair of edge support members; and a substrate-fixing member disposed on the horizontal substrate-supporting member to support a central portion of the glass substrate, wherein the substrate-fixing member is disposed to project upwardly from the horizontal substrate-supporting member.

12. The cassette according to claim 11, wherein the substrate-fixing member is disposed in a center portion of the horizontal substrate-supporting member.

13. The cassette according to claim 11, wherein the substrate-fixing member is vertically oriented.

14. The cassette according to claim 11, wherein the horizontal substrate-supporting member is made of a plastic material.

15. The cassette according to claim 1, wherein the substrate-fixing member is made of an elastomer material.

* * * * *